United States Patent [19]

Tang et al.

[11] Patent Number: 6,127,230

[45] Date of Patent: Oct. 3, 2000

[54] VERTICAL SEMICONDUCTOR DEVICE AND METHOD OF MANUFACTURING THE SAME

[75] Inventors: Zhirong Tang, Phoenix; Heemyong Park, Gilbert; Jenny M. Ford, Mesa, all of Ariz.

[73] Assignee: Motorola, Inc., Schaumburg, Ill.

[21] Appl. No.: 09/094,870

[22] Filed: Jun. 15, 1998

Related U.S. Application Data

[62] Division of application No. 08/625,016, Mar. 29, 1996, Pat. No. 5,872,374.

[51] Int. Cl.[7] .................................................. H01L 21/336
[52] U.S. Cl. ......................... 438/268; 269/276; 269/289; 269/291; 269/478; 269/491
[58] Field of Search .................................... 438/268, 269, 438/276, 289, 291, 478, 491; 257/328

[56] References Cited

U.S. PATENT DOCUMENTS

| | | |
|---|---|---|
| 4,893,160 | 1/1990 | Blanchard . |
| 5,034,785 | 7/1991 | Blanchard . |
| 5,164,325 | 11/1992 | Cogan et al. . |
| 5,443,992 | 8/1995 | Risch et al. . |
| 5,474,943 | 12/1995 | Hshieh et al. . |
| 5,479,037 | 12/1995 | Hshieh et al. . |
| 5,483,094 | 1/1996 | Sharma et al. . |
| 5,556,792 | 9/1996 | Zambrano ................................ 438/207 |
| 5,627,395 | 5/1997 | Witek et al. .............................. 257/350 |
| 5,721,438 | 2/1998 | Tang et al. ............................... 257/197 |
| 5,874,338 | 2/1999 | Ferla et al. ............................... 438/268 |

*Primary Examiner*—Carl Whitehead, Jr.
*Assistant Examiner*—Maria Guerrero
*Attorney, Agent, or Firm*—Daniel R. Collopy; Robert F. Hightower

[57] ABSTRACT

An n-channel device (10) and a p-channel device (11) are formed from a single epitaxial silicon layer (60,61). During the deposition of the single epitaxial silicon layer (60,61), dopants are added to the epitaxial reaction chamber and subsequently changed to define a drain region (24,33), a channel region (27,34), and a source region (30,35). The dopant concentration is modified during the formation of the channel region (27,34) to create a doping profile (50). The doping profile (50) has a first profile (51) that is constant and a second profile (52) that changes.

16 Claims, 4 Drawing Sheets

DOPING PROFILE THROUGH PEDESTAL

VERTICAL SEMICONDUCTOR DEVICE AND METHOD OF MANUFACTURING THE SAME

The present application is a divisional of U.S. application Ser. No. 08/625,016, now U.S. Pat. No. 5,872,374 filed on Mar. 29, 1996, which is hereby incorporated by reference, and priority thereto for common subject matter is hereby claimed.

BACKGROUND OF THE INVENTION

The present invention relates, in general, to field effect transistors, and more particularly to field effect transistors having low threshold voltages.

Field effect transistor (FET) devices are becoming increasingly important in low voltage, low power applications including personal communication (e.g., pagers, cellular phones, etc.) and portable computers. With lower power consumption being a primary requirement with these applications, FET devices are being scaled down in physical dimensions to operate at supply voltages less than 3.0 volts. However, semiconductor device parameters such as threshold voltage, subthreshold leakage currents, parasitic source/drain capacitances, and source to drain punchthrough typically limit the performance of low power, submicron semiconductor devices.

Source to drain punchthrough generally takes place with the merging of the source and drain depletion regions, which becomes more of a concern as the channel length is decreased. When punchthrough occurs, the gate region is unable to control carriers in the channel region. The device basically becomes a short circuit and is considered uncontrollable. One previously known method to overcome this problem is to increase the uniform channel doping with a channel implant to inhibit punchthrough. This approach, however, is not desirable for low voltage and low power applications due to the loss in device performance. For effective low power applications the threshold voltage of the devices should be below 0.6 volts.

An alternative approach is to maintain a lower channel doping concentration and place highly doped regions in a bilateral fashion on both the source and drain sides. These regions are often termed as halo or punchthrough stops. This approach inhibits punchthrough while maintaining lower threshold voltages (e.g., on the order of 0.3 volts). However, this approach suffers from higher capacitance and reduced drive capability (i.e., reduced transconductance), which in turn results in slower switching speeds.

As each device parameter is optimized for low power applications, there are two viewpoints that need to be considered when evaluating a low power device structure. The first perspective involves the physics of the device that determines the device performance and evaluates the interaction between all device parameters. For instance, there are several methods provided in the prior art that can be used to set the threshold voltage of semiconductor device. Each has its merits as a method to set threshold voltage, but the technique should also be judged based on the impact on all device parameters such as subthreshold leakage, punchthrough voltage, etc.

The second perspective that must be considered when evaluating a low power device structure determines the manufacturability of the proposed device. Again, any of the previously known methods to set threshold voltage are adequate to manufacture a limited number of devices in a research environment. These previously known methods, however, may not be effective when millions of devices must be manufactured in a high volume, cost sensitive production facility. The method used to fabricate the low power/low voltage device must be tolerant of normal process variance in device parameters such as channel length, channel depth, or gate oxide thickness. The proposed method should be robust enough to withstand normal variations in these parameters and produce devices that operate over the required performance conditions.

By now it should be appreciated that it would be advantageous to provide a semiconductor device that can operate under low voltage conditions. It would also be advantageous if the semiconductor device had improved punchthrough resistance and could be manufactured in fewer processing steps and lower cost than some previously known low power semiconductor devices.

DETAILED DESCRIPTION OF THE DRAWINGS

The present invention is directed towards providing a vertical semiconductor device that has improved punchthrough resistance and low power performance. A significant feature of the vertical semiconductor device is a pedestal structure that is made from a deposition process of a single epitaxial silicon layer. A method of forming the vertical semiconductor device is provided that obviates many of the process steps associated with forming traditional lateral devices, such as the photolithographic masks and implantation steps associated with the formation of source regions, drain regions, and halo regions.

In addition to being a vertical device, the semiconductor device of the present invention differs from traditional devices in that its source, channel, and drain regions are formed by doping the epitaxial silicon layer during the deposition process. The current electrodes of traditional devices are typically formed by using ion implantation and annealing processes. Therefore, the semiconductor device of the present invention can be made with improved control and reproducibility when compared to conventional devices that rely on the diffusion of dopants. Another feature of the present invention is that a semiconductor device with a short channel region can be made. More specifically, with the present invention it is possible to form devices that have channel lengths that are significantly smaller than the minimum dimension possible with the photolithographic process used to form the lateral semiconductor device. This is because the channel length is determined by the thickness of an epitaxial silicon layer as it is deposited rather than photolithographic definition or the out diffusion of dopants.

The present invention forms the source, channel, and drain region by varying the conductivity and concentration of dopants during the deposition of a single epitaxial layer. Because it is possible to accurately control the dopant concentration in the epitaxial silicon layer, it is possible to form a doping profile in the channel region to enhance the performance of the semiconductor device. As will be shown in more detail below, the doping profile in the channel region is formed so that it has two regions. The doping profile in the first region intersects the source region with a substantially constant dopant concentration. This is to enhance control of the threshold voltage and improve reproducibility from device to device. The doping concentration in the second region has a gradient profile to enhance the frequency response and transconductance of the semiconductor device as well as improve punchthrough resistance of the device.

Figure 1:
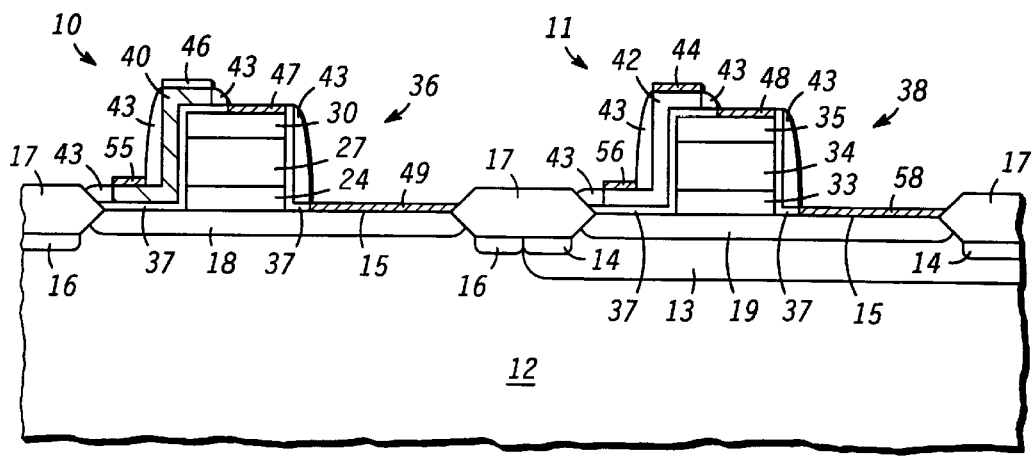
FIG. 1 is an enlarged cross-sectional view of two semiconductor devices in accordance with the present invention.

Referring now to FIG. 1, a more detailed description of the present invention is now provided. FIG. 1 is an enlarged cross-sectional view of an n-channel device 10 and a p-channel device 11. In the preferred embodiment of the present invention, a CMOS (Complementary Metal Oxide Semiconductor) implementation is shown. However, it should be understood that it is not necessary to form p-channel devices in conjunction with n-channel devices and vice versa. It is possible to form only n-channel or only p-channel devices instead.

N-channel device 10 and p-channel device 11 are also referred to hereinafter as devices, vertical semiconductor devices, or semiconductor devices. More particularly, n-channel device 10 and p-channel device 11 are Field Effect Transistors (FETs) that are formed vertically on a surface 15 of a body of semiconductor material, a substrate, or a semiconductor substrate 12. N-channel device 10 has a pedestal region 36 made from a single epitaxial silicon layer. Pedestal 36 comprises three regions further defined as a first body of semiconductor material, which acts as a drain region 24, a second body of semiconductor material, which acts as a channel region 27, and a third body of semiconductor material, which acts as a source region 30. A gate structure comprising a gate oxide layer 37 and a n-type gate polysilicon structure 40 is used to modulate channel region 27, between drain region 24 and source region 30. Electrical coupling to drain region 24 of n-channel device 10 is made by a doped region 18 and a first contact 49. Electrical coupling to the gate structure is made by a second contact 46, and electrical coupling to source region 30 is made by a third contact 47. It is also possible to electrically couple to n-type gate polysilicon structure 40 with a fourth contact 55.

P-channel device 11 has a pedestal region 38 made from a single epitaxial silicon layer. Pedestal 38 comprises a first region, which acts as a drain region 33, a second region, which acts as a channel region 34, and a third region, which acts as a source region 35. A gate structure comprising a gate oxide layer 37 and a p-type gate polysilicon structure 42 is used to modulate channel region 34 of p-channel device 11 between drain region 33 and source region 35. Electrical coupling to drain region 33 of p-channel device 11 is made by a doped region 19 and a first contact 58. Electrical coupling to the gate structure is made by a second contact 44, and electrical coupling to source region 35, is made by third contact 47. It is also possible to electrically couple to p-type gate polysilicon structure 42 with a fourth contact 56. N-channel device 10 and p-channel device 11 are electrically isolated from each other by field oxide regions 17, well 13, and doped isolation regions 14 and 16.

Because the active regions (source region, channel region, and drain region) of n-channel device 10 and p-channel device 11 are above surface 15, they are not in the bulk of semiconductor substrate 12. Therefore, n-channel device 10 and p-channel device 11 do not suffer from many of the parasitic leakage problems associated with conventional lateral devices. For example, devices 10 and 11 are not affected by substrate leakage currents, which improves both their breakdown voltage (Bvdss) capability and punch-through resistance. It is also much easier to predict and control the formation of a depletion region across channel region 27 and 34 as each device 10 and 11 is turned on. This allows the present invention to have improved control of the threshold voltage of each device 10 and 11.

N-channel device 10 and p-channel device 11 are vertical devices because the flow of current is generally perpendicular to surface 15. Traditional lateral devices have a current flow that is parallel to the surface of the substrate in which they are formed. Because devices 10 and 11 are vertical devices, the effective channel length of these devices is controlled predominantly by the thickness of channel region 27 and 34, respectively. The channel length, therefore, is not determined or limited by the photolithographic process, but rather by the thickness of the deposition process of the single epitaxial layer used to form pedestal 36 and 38. Preferably, pedestal 36 and 38 is about 500 angstroms to 15,000 angstroms thick and channel region 27 and 34 is about 300 angstroms to 10,000 angstroms thick.

The channel length of conventional lateral devices is predominantly controlled and limited by the photolithographic capability and the lateral diffusion of the source and drain regions. For this reason, the present invention offers improvement over lateral devices in that the effective channel length is not limited by any photolithographic process. Furthermore, the control and reproducibility of the effective channel length is no longer susceptible to variations in a particular photolithographic process.

Another feature of the present invention is the formation of a doping profile in channel region 27 and 34 of n-channel device 10 and p-channel device 11, respectively. Because the dopant concentrations in an epitaxial deposition can be more accurately controlled than the diffusion of dopants in a high temperature annealing process, it is possible to design the doping profile to enhance the performance and manufacturability of devices 10 and 11.

Figure 2:
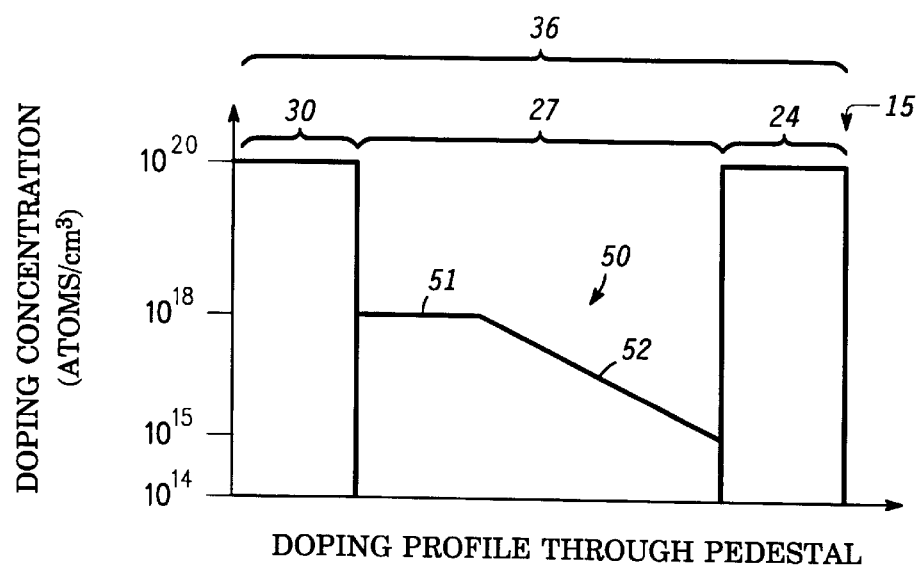
FIG. 2 is a graph showing a dopant concentration across one of the semiconductor devices of FIG. 1.

Turning now to FIG. 2, a more detailed description of the doping profile of channel region 27 is provided. FIG. 2 is a graph plotting the doping concentration in atoms/cm$^3$ along the y-axis in logarithmic scale as a function of position in pedestal 36 (labeled as bracket 36) of n-channel device 10. It should be understood that a similar graph could be generated for the doping profile of p-channel device 11, but the conductivities would be reversed and the concentrations might vary in accordance with the differences between an n-channel device and a p-channel device. Source region 30 and drain region 24 of n-channel device 10 are of n-type conductivity. Arsenic is preferably used to dope regions 24 and 30 to minimize the out diffusion of dopant. It should also be understood that regions 24 and 30 could be doped with phosphorus, antimony, or the like. Channel region 27, of n-channel device 10 is of p-type conductivity, which is preferably formed using boron as a dopant.

The relative dopant concentrations of these three regions 24, 27, and 30 of n-channel device 10 are shown in the graph of FIG. 2. An arrow 15 is used to indicate the relative position of surface 15 of substrate 12. Moving to the left along the x-axis from arrow 15 is the relative position within pedestal 36. The location of each of regions 24, 27, and 30 is indicated with the use of brackets that have the same reference numbers. As shown in FIG. 2, channel region 27 has a doping profile 50 that comprises two regions a first profile 51 and a second profile 52.

First profile 51 is a region where the p-type dopant is at a substantially equal or constant concentration. First profile 51 is formed such that it intersects or contacts source region 30 at one end. This is done intentionally so that if any process variations should occur during manufacturing, the dopant concentration of source region 30 will intersect the dopant concentration of channel region 27 at the same values. This improves the control of the threshold voltage of n-channel device 10 and improves the reproducibility of n-channel device 10 from one manufacturing lot to the next. In other words, the substantially constant dopant concentration of first profile 51 improves the robustness of n-channel device 10 so that it can tolerate process variations without producing significant variations in the performance between each device fabricated.

Second profile 52 of doping profile 50 is a gradient profile intended to electrically shape the depletion region spread (not shown) of channel region 27 to enhance the performance of n-channel device 10. As shown in FIG. 2, second profile 52 begins at the concentration level of first profile 51 and changes to a lower concentration value where second profile 52 intersects or contacts drain region 24. Preferably this change is substantially linear, however, it should be understood that it is possible that a geometric, a gausian, an exponential, or similar profile could also be used.

As will be described in more detail below, an epitaxial deposition process is used to form pedestals 36 and 38, and more particularly, channel region 27 and 34. This provides for accurate control of the doping concentrations throughout the device structure. This obviates the need to form halo regions as part of n-channel device 10 and p-channel device 11. Without halo regions, n-channel device 10 and p-channel device 11 can be operated as bi-directional devices. In other words, the classical meaning of a source region and a drain region, as it pertains to the direction of current flow, can be reversed. However, it should also be appreciated that the formation of halo regions or doped regions by either modifying the epitaxial silicon deposition process or by ion implantation may be desirable to modify particular performance features of a semiconductor device.

Again, pedestals 36 and 38 are each formed from the deposition of a single epitaxial silicon layer. Thus the present invention does not require photolithographic and implantation processes to form source regions 30 and 35 and drain regions 24 and 33. For this reason, n-channel device 10 and p-channel device 11 can be formed using 5 fewer photolithographic masks and up to 20 fewer process steps than some previously known, lateral semiconductor devices. Some of the process steps that are eliminated are rapid thermal annealing (RTA) processes that are used to activate and drive in dopants from implantation processes. By eliminating these annealing steps, the present invention improves the thermal budget of the manufacturing process and eliminates the process variability associated with the annealing steps. The reduction in mask count and process steps can also significantly reduce both the manufacturing costs and cycle time of the semiconductor devices of the present invention.

Figure 3:
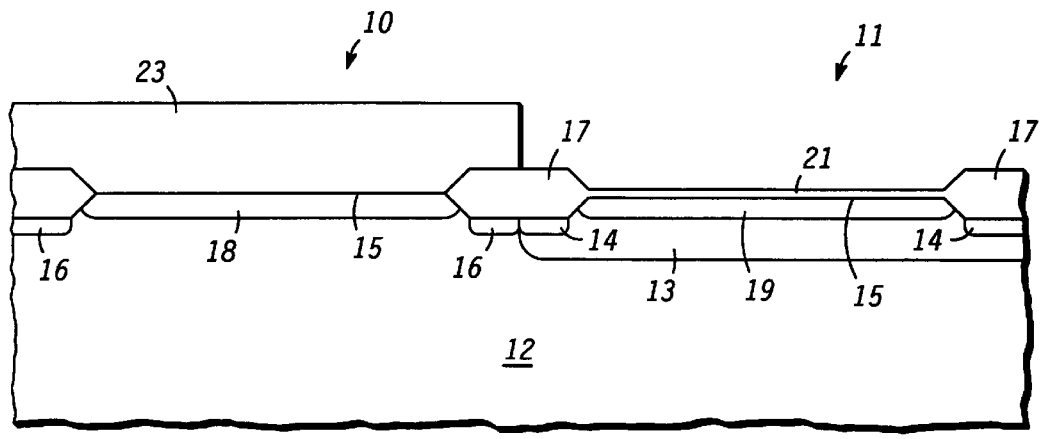
FIGS. 3–7 are enlarged cross-sectional views of the two semiconductor devices of FIG. 1 at various stages of fabrication.

Referring to FIG. 3, a method for forming n-channel device 10 and p-channel device 11 is now provided. FIG. 3 is an enlarged cross-sectional view of n-channel device 10 and p-channel device 11 at an early stage of fabrication. To begin, semiconductor substrate 12, made preferably of silicon that is lightly doped to be of p-type conductivity, is provided. Well region 13 and isolation doped regions 14 and 16 are then formed using conventional photolithographic, implantation, and anneal steps. A localized oxidation of silicon (LOCOS) is then used to form field oxide regions 17.

A screen oxide layer 21 is then formed on surface 15 of semiconductor substrate 12 where devices 10 and 11 are formed. At this point in the process flow, arrows 10 and 11 indicate where n-channel device 10 and p-channel device 11 are formed in the steps that follow. A conventional photolithographic and implantation process is used to form doped region 18 for n-channel device 10. Preferably, doped region 18 is formed using a n-type dopant such as arsenic such that there is a surface concentration of about $1.0 \times 10^{20}$ atoms/cm$^3$. The portion of screen oxide layer 21 where n-channel device 10 is formed is then removed with a wet etch solution providing the structure as shown in FIG. 3.

A layer of photoresist 23 is then deposited and patterned onto semiconductor substrate 12. Layer of photoresist 23 is used to protect the region where n-channel device 10 will be formed while doped region 19 of p-channel device 11 is formed. A boron source is implanted into the exposed portions of semiconductor substrate 12 to form doped region 19 so that it has a surface concentration of about $1.0 \times 10^{20}$ atoms/cm$^3$. Layer of photoresist 23 is then removed and a rapid thermal anneal of about 30 seconds to 2 minutes at about 950° C. to 1150° C. is used to activate the dopants used to form doped regions 18 and 19, well 13, and isolation doped region 14 and 16.

Figure 4:
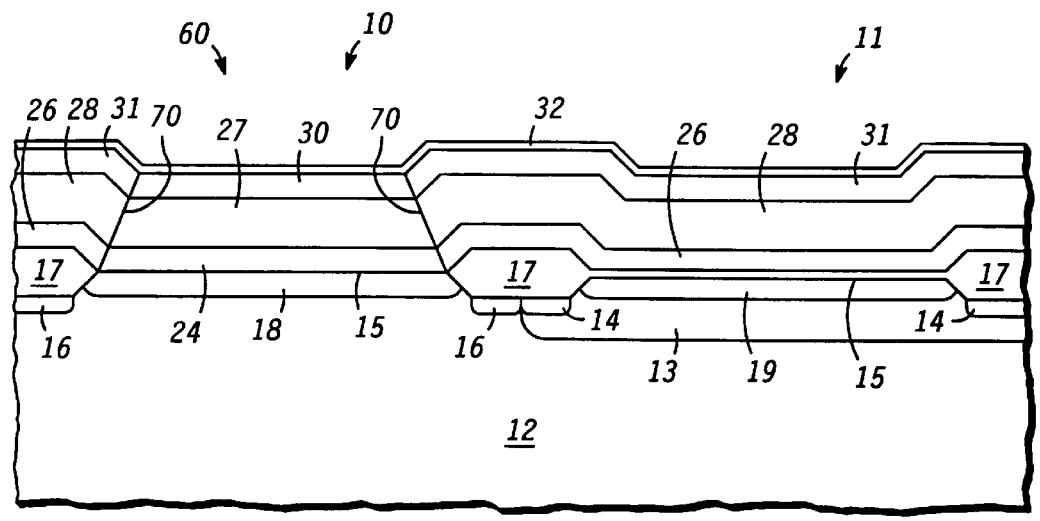

Turning to FIG. 4, a wet etch process is performed to remove any oxides or contaminants that may be present of surface 15 where n-channel device 10 is to be formed. After the cleaning process, a portion of screen oxide layer 21 will still remain over the portion of semiconductor substrate 12 where p-channel device 11 will be formed. This insures that the exposed portions of semiconductor substrate 12, where n-channel device 10 is formed, are the only portions that are single crystal silicon. The other exposed portions of semiconductor substrate 12 have an amorphous crystal structure since they are covered with silicon dioxide that has no crystal pattern.

A single epitaxial silicon layer 60 is then deposited onto surface 15 of semiconductor substrate 12. Semiconductor substrate 12 is placed into an epitaxial reaction chamber that is at an temperature of about 350° C. to 1100° C. and a pressure of 1 mtorr to 760 torr. A silicon source such as silane, dichlorosilane, or the like is introduced into the reaction chamber to form a seed layer of kink sites for the formation of single epitaxial silicon layer 60. An arsenic source such as arsine is then introduced into the reaction chamber to form drain region 24 and a first amorphous layer 26. Due to the crystal orientation of surface 15, only drain region 24 will maintain the single crystal orientation of semiconductor substrate 12. The portion of single epitaxial silicon layer 60, shown in FIG. 4 as first amorphous layer 26, will have either an amorphous or polycrystalline structure since the underlying silicon dioxide has no reproducible crystal pattern to follow.

The concentration of arsenic in drain region 24 can be varied to optimize the performance of n-channel device 10, and is preferably at a concentration of about $1.0 \times 10^{17}$ atoms/cm$^3$ to $1.0 \times 10^{20}$ atoms/cm . The deposition proceeds until drain region 24 is about 300 angstroms to 5,000 angstroms thick. The source of arsenic is removed from the reaction chamber and a source of boron such as diboronfluoride (BF$_2$) is added. The transition from n-type dopant to p-type dopant marks the point at which drain region 24 ends and channel region 27 begins. The p-type dopant concentration is then gradually increased, preferably linearly, to form second doping profile 52 (see FIG. 2) as channel region 27 is formed.

During the formation of channel region 27, p-type amorphous silicon will be deposited on first amorphous silicon layer 26 to form a second amorphous silicon layer 28.

Because the underlying drain region 24 has a single crystal orientation, channel region 27 will also be deposited as single crystal epitaxial silicon. The p-type dopant used to form second doping profile 52 is first added to reaction chamber with a concentration of about $1.0 \times 10^{13}$ atoms/cm$^3$ to $5.0 \times 10^{17}$ atoms/cm$^3$ and increases to about $5.0 \times 10^{14}$ atoms/cm$^3$ to $1.0 \times 10^{19}$ atoms/cm$^3$. The p-type dopant concentration is kept at a constant value to form first doping profile 51 (see FIG. 2).

The deposition of single epitaxial silicon layer 60 continues with the p-type dopant concentration in the reaction chamber held at a constant value for the remainder of the deposition of channel region 27. Preferably, channel region 27 is about 300 angstroms to 10,000 angstroms thick, first doping profile 51 is about 150 angstroms to 5,000 angstroms thick, and second doping profile 52 is about 150 angstroms to 5,000 angstroms thick.

The p-type dopant source is then removed or terminated from the epitaxial reaction chamber and an n-type dopant source is added to begin deposition of source region 30. A phosphorus or arsenic source is added as the n-type dopant so that source region 30 has a dopant concentration of about $1.0 \times 10^{17}$ atoms/cm$^3$ to $1.0 \times 10^{20}$ atoms/cm$^3$. The n-type dopant concentration is held constant for the entire duration of the deposition of source region 30. Preferably, source region 30 is about 300 angstroms to 5,000 angstroms thick and will replicate the single crystal lattice pattern of channel region 27. During the deposition of source region 30, a third amorphous layer 31 is formed on second amorphous layer 28. The transition between the single crystal regions of drain region 24, channel region 27, and source region 30 and the amorphous regions of amorphous layers 26, 28, and 31 is shown in FIG. 4 as transition lines 70.

One advantage of the present invention is that drain region 24, channel region 27, and source region 30 are formed in a continuous deposition process of a single epitaxial silicon layer 60. As a result, there is no need to remove semiconductor substrate 12 from the epitaxial reaction chamber after the formation of drain region 24 or channel region 27, so there is no risk of forming an interface of silicon dioxide between drain region 24 and channel region 27 or between channel region 27 and source region 30. Some previously known vertical devices are form such that the drain, channel, and source regions are formed as separate depositions with ion implantation steps inserted between each deposition step. This can cause an interface of dielectric material to form between the different regions, which can degrade the performance of the device.

After the deposition of single epitaxial silicon layer 60, substrate 12 is removed from the epitaxial reaction chamber. A silicon dioxide layer 32 is then formed on source region 30 and third amorphous layer 31. Silicon dioxide layer 32 is about 300 angstroms to 500 angstroms thick and can be formed from a low temperature chemical vapor deposition (CVD) process using a source gas such as tetraethylorthosilicate (TEOS).

Figure 5:
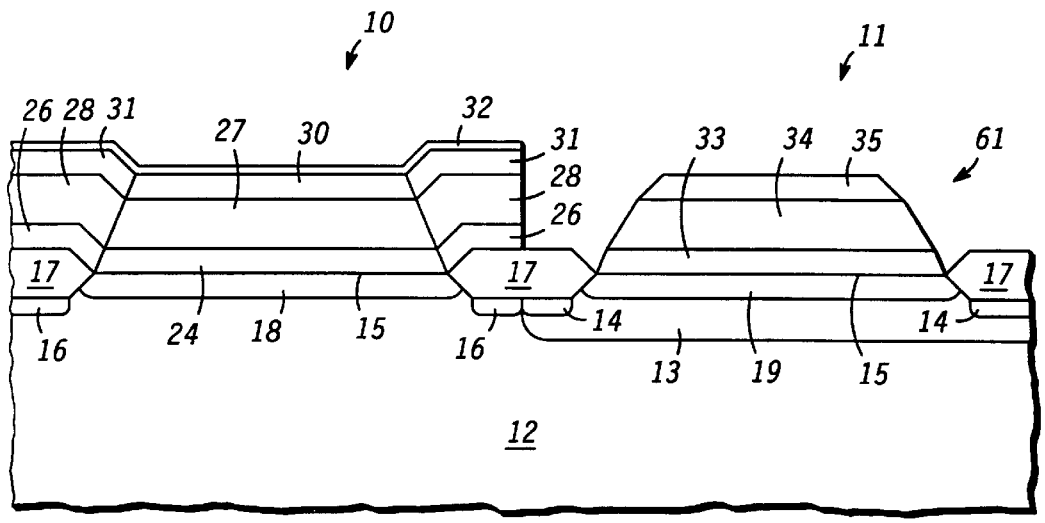

Turning now to FIG. 5, a second photoresist layer (not shown) is formed on silicon dioxide layer 32. The second photoresist layer is patterned such the portion of silicon dioxide layer 32, where p-channel device 11 is made, is exposed. A wet etch solution comprising hydrofluoric acid is then used to remove the exposed portions of silicon dioxide layer 32. A wet etch solution comprising nitric acid and an RIE etch is then used to remove the exposed portions of third amorphous layer 31, second amorphous layer 28, and first amorphous layer 26. This will expose the underlying portion of field oxide regions 17 and surface 15 where p-channel device 11 is formed. The second photoresist layer is then removed to allow further processing.

At this point in the process flow, the only exposed portion of semiconductor substrate 12 that has a single crystal orientation is the portion of surface 15 where p-channel device 11 is formed. The rest of semiconductor substrate 12 is covered with either field oxide regions 17 or remaining portions of silicon dioxide layer 32. These regions do not have a single crystal orientation. For this reason, it is possible to use a selective epitaxial growth process to form a single epitaxial layer 61 where p-channel device 11 is formed.

To form single epitaxial layer 61 as shown in FIG. 5, semiconductor substrate 12 is once again placed into an epitaxial reaction chamber. The deposition sequence of single epitaxial layer 61 is similar to the deposition of single epitaxial layer 60 used to form n-channel device 10 except the conductivity of the dopants is reversed. Single epitaxial layer 61 is only formed on the exposed portion of surface 15 of semiconductor substrate 12. Drain region 33 is formed by introducing a silicon source gas and a p-type dopant such as boron into the reaction chamber. Preferably, drain region 33 is about 300 angstroms to 5,000 angstroms thick and has a p-type doping concentration of about $1.0 \times 10^{17}$ atoms/cm$^3$ to $1.0 \times 10^{20}$ atoms/cm$^3$.

To begin deposition of channel region 34, the p-type dopant source is removed and an n-type dopant such as phosphorus is introduced into the reaction chamber. Phosphine can be used as a source of phosphorus and it is also possible to use other n-type dopants such as arsenic or antimony. The concentration of n-type dopant is increased as the deposition of channel region 34 proceeds so that a doping profile similar to that of second doping profile 52 (see FIG. 2) is formed. At the start of the deposition of channel region 34, the n-type dopant concentration is about $1.0 \times 10^{13}$ atoms/cm$^3$ to $5.0 \times 10^{17}$ atoms/cm$^3$. The concentration is increased until it reaches about $5.0 \times 10^{14}$ atoms/cm$^3$ to $1.0 \times 10^{19}$ atoms/cm$^3$. The concentration of n-type dopant is then maintained at a constant value as the remainder of channel region 34 is deposited. This will form a constant doping profile, similar to first doping profile 51 of FIG. 2, in channel region 34 at the point where source region 35 is formed. Preferably, channel region 34 is about 300 angstroms to 10,000 angstroms thick. In addition, the portion of channel region 34 that has an increasing doping profile and the portion that has a constant doping concentration are about 150 angstroms to 5,000 angstroms thick. It should also be understood that the width of the doping profiles can be modified to adjust the performance of p-channel device 11.

Upon completion of channel region 34, the addition of an n-type dopant source is terminated and a p-type dopant is added to the reaction chamber to begin the deposition of source region 35. Preferably, source region 35 is about 300 angstroms to 5,000 angstroms thick and has a p-type doping concentration, such as boron, of about $1.0 \times 10^{17}$ atoms/cm$^3$ to $1.0 \times 10^{20}$ atoms/cm$^3$. In some cases, the concentration of source region 35 may be at least an order of magnitude greater than the concentration of channel region 34.

Drain region 33, channel region 34, and source region 35 are all formed in the deposition of a single epitaxial layer 61. To define or form the individual regions 33, 34, and 35 of single epitaxial layer 61, the conductivity of a dopant incorporated into the epitaxial silicon is changed. Since the three regions 33, 34, and 35 are formed in a single deposition process, semiconductor substrate 12 is not removed from the reaction chamber until after all three regions 33, 34, and 35 are formed. This prevents the formation of a dielectric layer such as silicon dioxide at the interface between drain region 33 and channel region 34 or between channel region 34 and source region 35.

Following the deposition of single epitaxial layer 61, semiconductor substrate 12 is removed from the epitaxial reaction chamber and a wet etch comprising hydrofluoric acid is used to remove the remaining portions of silicon dioxide layer 32. It should also be understood that the wet etch will also remove an insignificant portion of field oxide regions 17 and will have a minimal effect on single epitaxial layer 60 or single epitaxial layer 61.

Figure 6:
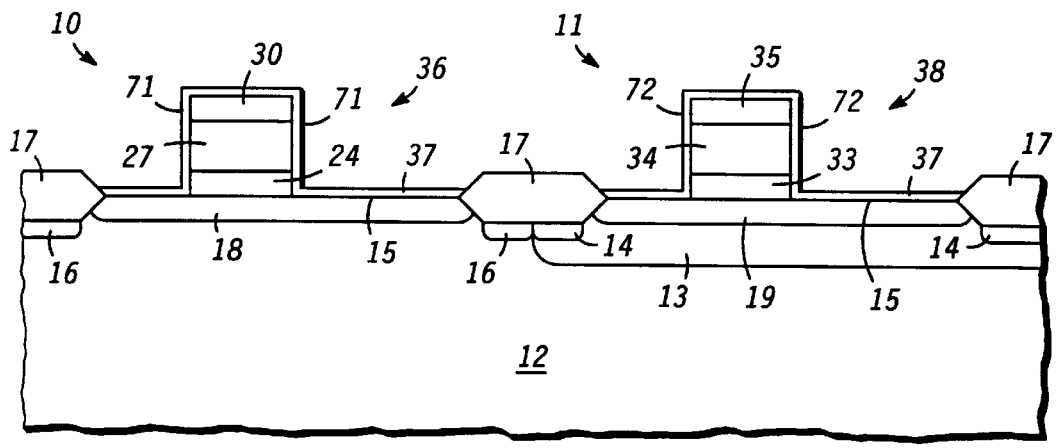

A third photoresist layer (not shown) is then formed on semiconductor substrate 12. The third photoresist layer is patterned to expose portions of single epitaxial layer 60 and single epitaxial layer 61. A reactive ion etch (RIE) is then used to remove the exposed portions of single epitaxial layer 60 and single epitaxial layer 61 leaving pedestal 36 and pedestal 38 as shown in FIG. 6. The RIE etch defines the sides 71 of pedestal 36 and the sides 72 of pedestal 38. The third photoresist layer is then removed and semiconductor substrate 12 is placed in an oxidizing ambient to form gate oxide layer 37. Preferably, the oxidizing ambient is a dry, oxygen rich ambient at a temperature of about 600° C. to 800° C. Gate oxide layer 37 is about 15 angstroms to 300 angstroms thick. Optionally, a sacrificial oxide layer (not shown) may be formed on semiconductor substrate and subsequently removed prior to the formation of gate oxide layer 37.

Figure 7:
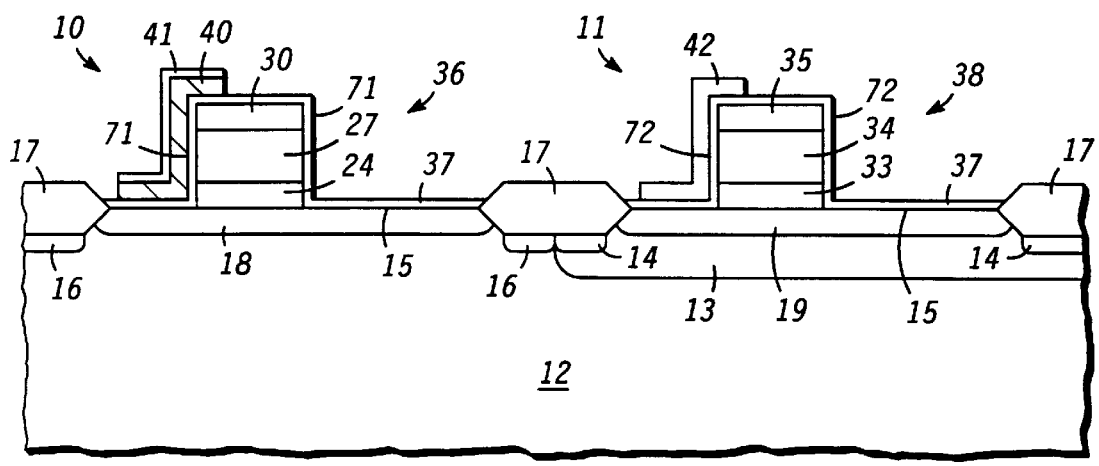

Referring now to FIG. 7, the sequence of process steps to form n-type gate polysilicon structure 40 and p-type gate polysilicon structure 42 is provided. An n-type polysilicon layer (not shown) with a thickness of about 150 angstroms to 3,000 angstroms is deposited onto semiconductor substrate 12. The n-type polysilicon layer is doped in-situ with an n-type dopant such as phosphorus to enhance its electrical characteristics. A silicon nitride layer (not shown) with a thickness of about 150 angstroms to 500 angstroms is then deposited onto the n-type polysilicon layer. A fourth photoresist layer (not shown) is deposited and patterned to expose portions of the silicon nitride layer. An RIE etch is then used to remove the exposed portions of the silicon nitride layer and the underlying n-type polysilicon layer. This leaves a portion of n-type gate polysilicon structure 40 and a silicon nitride portion 41 as shown in FIG. 7. Note, the portion of the silicon nitride layer and the n-type polysilicon layer that are in the region where p-channel device 11 is formed, are removed with the RIE etch. It should also be understood that n-type gate polysilicon structure 40 could be formed on both sides 71 of pedestal 36.

The fourth photoresist layer is removed and a p-type polysilicon layer (not shown) is then deposited onto semiconductor substrate 12 including the region where n-channel device 10 is formed. A fifth photoresist layer (not shown) is then deposited and pattern to expose portions of the p-type polysilicon layer. An RIE etch is used to remove the exposed portions and define p-type gate polysilicon structure 42 as shown in FIG. 7. The remaining silicon nitride portion 41 on n-type gate polysilicon structure 40 is used to protect n-type gate polysilicon structure 40 during the RIE etch. The fifth photoresist layer is then removed and semiconductor substrate 12 is placed into a wet etch solution comprising phosphoric acid to remove silicon nitride portion 41.

In the preferred embodiment, n-type gate polysilicon structure 40 and p-type gate polysilicon structure 42 are formed from different polysilicon layers having different conductivities. This is done to enhance the electrical characteristics of n-channel device 10 and p-channel device 11. By doping the conductivity of the gate structure of n-channel device 10 and p-channel device 11 to the same conductivity as their respective drain regions 24 and 33, there is improved control of their respective threshold voltages. It should also be understood that the formation of p-type gate polysilicon structure 42 could be performed using the same n-type polysilicon layer used to form n-type gate polysilicon structure 40.

Turning back now to FIG. 1, the final process steps of n-channel device 10 and p-channel device 11 are provided. A layer of dielectric material (not shown), with a thickness of about 500 angstroms to 5,000 angstroms, is deposited onto semiconductor substrate 12. Preferably, the layer of dielectric material is a layer of silicon dioxide that is formed using a plasma enhanced chemical vapor deposition (PECVD) process employing TEOS. The layer of dielectric material is then anisotropically etched with an RIE etch to define spacers 43 as shown in FIG. 1. The RIE etch will also expose portions of semiconductor substrate 12, pedestals 36 and 38, and the gate structures of n-channel device 10 and p-channel device 11 so that proper electrical contacts can be formed to each device 10 and 11.

A silicidation process is used to form contacts 44, 46, 47, 48, 49, 55, 56 and 58. A layer of refractory material such as titanium, cobalt, or the like is deposited onto semiconductor substrate 12. The refractory material will react with the exposed portions of silicon to form contacts 44, 46, 47, 48, 49, 55, 56, and 58. The presence of spacers 43 will prevent the formation of silicide in these regions and thus electrically isolate the contacts from each other. It should be understood that other metallization processes known in the art could be used to make electrical contact to drain regions 24 and 33, source regions 30 and 35, and to n-type gate polysilicon structure 40 and p-type gate polysilicon structure 42.

There are several advantages to the method of forming the semiconductor devices of the present invention when compared to the process used to form some previously known semiconductor devices intended for low voltage and low power applications. In the present invention, drain regions 24 and 33, channel regions 27 and 34, and source regions 30 and 35 are formed from the deposition of an epitaxial layer and the dopant used to define each region is added during the deposition process. Therefore, the present invention does not require the use of photolithographic masks or implantation steps to form these regions. The present invention also eliminates many of the anneal steps that are used in traditional lateral devices to drive or move dopant to the desired location.

Another advantage is the use of doped region 18 and 19 to electrically couple to drain regions 24 and 33, respectively. This allows for electrical contact to be made to all terminals of n-channel device 10 and p-channel device 11 from the same side of semiconductor substrate 12. Some previously known semiconductor devices make contact to the drain region using a backside contact that is on the opposite side as the source contact. As a result, these previously known devices have metallization processes that are more complicated or expensive than the present invention.

By now it should be appreciated that the present invention provides a vertical semiconductor device and a method for forming the same. A significant portion of the semiconductor device of the present invention is formed with the deposition of a single epitaxial layer. This allows for the semiconductor device to be formed with a channel region that has a well controlled and defined doping profile. The doping profile not only enhances the performance of the semiconductor device, but makes the semiconductor device more tolerant of process variations without affecting the performance of each device. The method of forming the semiconductor device of the present invention does so with fewer photolithographic masks and process steps than other traditional lateral devices. Thus the present invention has both reduced manufacturing cost and a shorter cycle time than other traditional devices.

What is claimed is:

1. A method for manufacturing a vertical semiconductor device comprising the step of:

providing a semiconductor substrate having a surface;

forming a doped region in the semiconductor substrate;

forming an epitaxial silicon layer overlying the surface of the semiconductor substrate and having a side;

doping the epitaxial silicon layer with a dopant during the step of forming, wherein the dopant is changed from a first conductivity to a second conductivity to form a first region and a second region, respectively, and the dopant is changed from the second conductivity to the first conductivity to form a third region;

forming a first contact to the doped region, wherein the doped region is coupled to the first region of the epitaxial silicon layer so that the first contact is electrically coupled to first region;

wherein the step of doping the epitaxial silicon layer to form the second region includes the step of forming a dopant profile comprising a first profile and a second profile, the first profile of the dopant profile being substantially constant and in contact with the third region, and the second profile of the dopant profile has a gradient profile; and forming a gate structure along the side of the epitaxial silicon layer.

2. The method of claim 1 wherein the step of forming the gate structure includes forming a polysilicon layer of the first conductivity.

3. The method of claim 1 wherein the step of forming the epitaxial silicon layer includes defining the first region with an arsenic concentration.

4. The method of claim 1 wherein the second region of the epitaxial silicon layer is less than about 1,000 angstroms thick.

5. The method of claim 1 wherein the gradient profile of the second profile comprises a first concentration and a second concentration and the gradient profile changes substantially linearly from the first concentration to the second concentration.

6. The method of claim 1 further comprising the step of forming a second contact coupled to the gate structure, wherein the first contact and the second contact are both on a same side of the semiconductor substrate.

7. The method of claim 5 wherein the gradient profile is in contact with the first region of the epitaxial silicon layer and contacts the first profile of the dopant profile.

8. The method of claim 6 wherein the step of forming the epitaxial silicon layer includes defining the second region with a boron concentration.

9. A method for manufacturing a vertical semiconductor device comprising the steps of:

providing a semiconductor substrate having a surface;

forming a doped region in the semiconductor substrate;

forming an epitaxial silicon layer overlying the surface of the semiconductor substrate and having a side formed by etching a portion of the epitaxial silicon layer to provide the side and to form a pedestal comprising the first region, the second region, and the third region;

doping the epitaxial silicon layer with a dopant during the step of forming, wherein the dopant is changed from a first conductivity to a second conductivity to form a first region and a second region, respectively, and the dopant is changed from the second conductivity to the first conductivity to form a third region;

forming a first contact to the doped region, wherein the doped region is coupled to the first region of the epitaxial silicon layer so that the first contact is electrically coupled to first region; and wherein the step of doping the epitaxial silicon layer to form the second region includes the step of forming a dopant profile comprising a first profile and a second profile, the first profile of the dopant profile being substantially constant and in contact with the third region, and the second profile of the dopant profile has a gradient profile.

10. A method for making a semiconductor device comprising the steps of:

providing a body of semiconductor material having a surface;

forming a first body of epitaxial silicon of a first conductivity overlying the body of semiconductor material;

forming a second body of epitaxial silicon of a second conductivity overlying at least a portion of the first body, wherein the second body has a doping profile comprising a first profile and a second profile;

forming a third body of epitaxial silicon of the first conductivity and overlying at least a portion of the second body;

wherein the first profile has a first concentration that is substantially constant and the second profile has a beginning point at a second concentration, which is less than the first concentration, and the second profile has an end point that is equal to the first concentration; and etching the first body of epitaxial silicon, the second body of epitaxial silicon, and the third body of epitaxial silicon to form a pedestal, wherein the pedestal has a side.

11. The method of claim 10 further comprising the step of forming a gate structure along the side of the pedestal, wherein the gate structure is coupled to the second body of epitaxial silicon.

12. The method of claim 10 wherein the second profile changes substantially linearly from the beginning point to the end point.

13. The method of claim 12 wherein the beginning point is in contact with the first body of epitaxial silicon and the end point is in contact with the first profile.

14. The method of claim 10 wherein the second body of epitaxial silicon has a thickness defined as a distance from the first body of epitaxial silicon to the third body of epitaxial silicon and the thickness is less than about 1,000 angstroms.

15. The method of claim 10 further comprising the step of forming a doped region in the body of semiconductor material, wherein the doped region is contiguous with the surface and in contact with the first body of epitaxial silicon.

16. The method of claim 15 further comprising the step of forming a contact on the surface of the body of semiconductor material such that the contact is coupled to the first body of epitaxial silicon and on a same side of the body of semiconductor material as the first body of epitaxial silicon layer.

* * * * *